United States Patent
Baek et al.

(10) Patent No.: US 9,123,695 B2
(45) Date of Patent: Sep. 1, 2015

(54) NANOWIRE FIELD-EFFECT TRANSISTOR AND METHOD FOR MANUFACTURING SAME

(71) Applicant: POSTECH ACADEMY—INDUSTRY FOUNDATION, Pohang-si (KR)

(72) Inventors: ChangKi Baek, Pohang-si (KR); TaiUk Rim, Pohang-si (KR); MyungDong Ko, Busan (KR)

(73) Assignee: POSTECH ACADEMY-INDUSTRY FOUNDATION, Pohang-Si (KR)

( * ) Notice: Subject to any disclaimer, the term of this patent is extended or adjusted under 35 U.S.C. 154(b) by 0 days.

(21) Appl. No.: 14/385,450

(22) PCT Filed: Mar. 11, 2013

(86) PCT No.: PCT/KR2013/001939
§ 371 (c)(1),
(2) Date: Sep. 15, 2014

(87) PCT Pub. No.: WO2013/137605
PCT Pub. Date: Sep. 19, 2013

(65) Prior Publication Data
US 2015/0069330 A1    Mar. 12, 2015

(30) Foreign Application Priority Data
Mar. 13, 2012 (KR) ................ 10-2012-0025726
Jul. 17, 2012 (KR) ................ 10-2012-0077624

(51) Int. Cl.
*H01L 29/06* (2006.01)
*H01L 29/423* (2006.01)
*H01L 29/775* (2006.01)
*B82Y 10/00* (2011.01)
*B82Y 40/00* (2011.01)
*H01L 29/66* (2006.01)
*H01L 29/10* (2006.01)
*B82Y 15/00* (2011.01)

(52) U.S. Cl.
CPC .......... *H01L 29/42392* (2013.01); *B82Y 10/00* (2013.01); *B82Y 40/00* (2013.01); *H01L 29/0676* (2013.01); *H01L 29/1025* (2013.01); *H01L 29/66439* (2013.01); *H01L 29/775* (2013.01); *B82Y 15/00* (2013.01); *Y10S 977/891* (2013.01); *Y10S 977/938* (2013.01)

(58) Field of Classification Search
CPC .......................... H01L 29/06; H01L 29/7606
USPC .......... 257/9, 29, 43, E29.245; 438/104, 142, 438/151
See application file for complete search history.

(56) References Cited

U.S. PATENT DOCUMENTS

| | | | |
|---|---|---|---|
| 2008/0224133 A1* | 9/2008 | Park et al. | 257/43 |
| 2012/0168711 A1* | 7/2012 | Crowder et al. | 257/9 |
| 2012/0305893 A1* | 12/2012 | Colinge | 257/29 |

* cited by examiner

Primary Examiner — Phuc Dang
(74) Attorney, Agent, or Firm — Foley & Lardner LLP

(57) ABSTRACT

Provided are a nanowire field-effect transistor and a method for manufacturing the same. The nanowire field-effect transistor can enable a source region to be positioned, with respect to an asymmetrical nanowire channel, adjacent to a region in which the diameter of the nanowire channel is large, can enable a drain region to be positioned adjacent to a region in which the diameter of the nanowire channel is small, can enable an ON current to be increased in a state in which a threshold voltage level is kept the same, and can enable the current drivability of a gate electrode to be improved.

13 Claims, 5 Drawing Sheets

NANOWIRE FIELD-EFFECT TRANSISTOR AND METHOD FOR MANUFACTURING SAME

RELATED APPLICATIONS

This application is the U.S. National Stage of International Application Number PCT/KR2013/001939, filed Mar. 11, 2013, which claims priority to and the benefit of Korean Patent Application Number 10-2012-0025726, filed Mar. 13, 2012 and Korean Patent Application Number 10-2012-0077624, filed Jul. 17, 2012. The entire contents of the foregoing applications are hereby incorporated herein by reference.

TECHNICAL FIELD

The present invention relates to a nanowire field-effect transistor and a method for manufacturing the same, and more particularly, to a nanowire field-effect transistor that adopts a gate-all-around structure and a method for manufacturing the same.

BACKGROUND ART

A field-effect transistor is an essential device for electronic components such as a currently available memory or the like. Such a field-effect transistor has been developed in such a manner as to reduce a size of a channel for the purpose of high performance and high integration. However, as a size of a device enters a nanometer scale, a problem of performance degradation of the device such as short channel effect has emerged due to the limit of channel control capability of a gate electrode.

Meanwhile, a nanowire has a linear structure with a size in a nanometer unit, and generally has a diameter of several nanometers to several hundreds of nanometers. In order to take advantage of such a nanowire in ultrafine/high-efficiency electronic components, the research and development are underway in many institutions around the world.

When manufacturing a field-effect transistor using such a nanowire, the size of the device may be reduced and control capability of the gate electrode of the device may be improved by quantum effect. Thus, it is possible to obtain effects such as improvement of the performance of the device, a reduction in the power consumption, and the like.

In the conventional nanowire field-effect transistor, it is a general way to manufacture horizontally arranged nanowires using a top-down method, which is used in an existing semiconductor process, as is. However, when using the horizontally arranged nanowires, it is difficult to reduce an area acquired by the device.

In addition, when manufacturing a device using nanowires obtained in a bottom-up method that is new semiconductor process technology, high-integration is impossible due to difficult alignment of the nanowires.

In order to solve such problems, research on a method of achieving high-integration using nanowires arranged vertically to a substrate has been actively conducted. However, when manufacturing the vertically arranged nanowires using the top-down method or the bottom-up method, it is difficult to uniformly form a diameter of the nanowire.

DISCLOSURE

Technical Problem

The present invention is directed to providing a nanowire field-effect transistor that may increase a driving current by adopting nanowires having irregular diameters, and a method for manufacturing the same.

Technical Solution

One aspect of the present invention provides a nanowire field-effect transistor including: an asymmetrical nanowire channel whose both ends have mutually different diameters; a source region that is adjacent to a region in which the diameter of the nanowire channel is large; a drain region that is adjacent to a region in which the diameter of the nanowire channel is small; a gate electrode that encloses the nanowire channel; and a gate insulation film that is positioned between the nanowire channel and the gate electrode.

Here, the diameter of the asymmetrical nanowire channel may be reduced from the source region toward the drain region.

Also, the nanowire field-effect transistor may further include a substrate that is disposed adjacent to the source region.

Also, the nanowire channel may be formed vertically to the substrate.

Also, the asymmetrical nanowire channel may be made of silicon.

Also, the diameter of the asymmetrical nanowire channel may be 5 nm to 1 μm.

Also, the same kind of impurities may be introduced to the source region and the drain region, and concentrations of the introduced impurities may be mutually different.

Also, the concentration of the impurities introduced to the drain region may be higher than the concentration of the impurities introduced to the source region.

Also, the impurities may be boron (B), boron difluoride ($BF_2$), phosphorus (P), arsenic (As), or antimony (Sb).

Another aspect of the present invention provides a method for manufacturing a nanowire field-effect transistor including: forming an asymmetrical nanowire whose both ends have mutually different diameters; defining any one of a source region and a drain region by introducing impurities at an end of the nanowire; forming a gate insulation film so as to enclose a part of the nanowire; forming a gate electrode so as to enclose the gate insulation film; and defining the remaining one of the source region and the drain region by introducing the impurities at the other end of the nanowire.

Here, the asymmetrical nanowire may be formed in a top-down method or a bottom-up method.

Also, concentration of the impurities introduced to the end of the nanowire and concentration of the impurities introduced to the other end thereof may be made different from each other.

Also, concentration of the introduced impurities may be $10^{17}$ cm$^{-3}$ to $10^{21}$ cm$^{-3}$.

Advantageous Effects

According to the present invention, the nanowire field-effect transistor can enable a source region to be positioned, with respect to an asymmetrical nanowire channel, adjacent to a region in which the diameter of the nanowire channel is large, can enable a drain region to be positioned adjacent to a region in which the diameter of the nanowire channel is small, can enable an ON current to be increased in a state in which a threshold voltage level is kept the same, and can enable the current drivability of a gate electrode to be improved.

In addition, the same kind of impurities may be introduced to the source region and the drain region and the concentration of the introduced impurities may be adjusted, and therefore it is possible to design a device optimized according to fields of applications.

The technical effects of the present invention are not limited to the aforementioned effects, and other technical effects that are not mentioned may be definitely understood by the person skilled in the art from the following description.

MODES OF THE INVENTION

Figure 1:
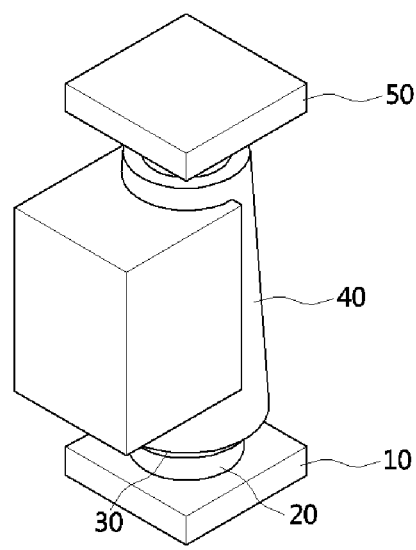
FIG. 1 is a perspective view showing a nanowire field-effect transistor according to an embodiment of the present invention.

Hereinafter, preferred embodiments of the present disclosure will be described in detail with reference to the accompanying drawings. However, the description proposed herein is merely a preferable example for the purpose of illustration only, not intended to limit the scope of the disclosure, and thus it should be understood that other equivalents and modifications could be made thereto without departing from the spirit and scope of the disclosure.

In the present specification, in a case in which a layer refers to be "on" another layer or substrate, the layer may be formed directly on the other layer or substrate, or a third layer may be interposed therebetween. In addition, in the present specification, expression of direction of the top, upper (part), upper surface, or the like can be understood as a means of the bottom, lower (part), lower surface, or the like depending on the criteria. In other words, the representation of the spatial direction must be understood as relative direction, and is not limited to be construed to mean the absolute direction.

In the drawings, for clarity, the thickness of the layer and regions may be exaggerated or omitted. Throughout the specification, the same reference numerals refer to the same components.

A nanowire field-effect transistor having a structure of gate-all-around (GAA) may have various advantages such as achieving high integration, preventing short channel effect, exhibiting ballistic transport characteristics, and the like, and thereby has attracted attention.

Figure 2:
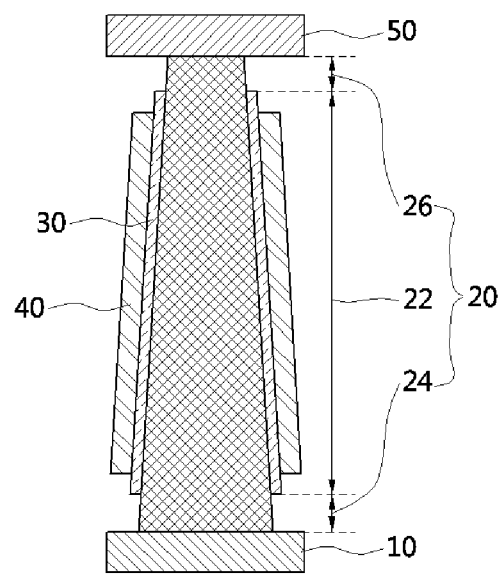
FIG. 2 is a cross-sectional view showing a nanowire field-effect transistor according to an embodiment of the present invention.

FIG. 1 is a perspective view showing a nanowire field-effect transistor according to an embodiment of the present invention, and FIG. 2 is a cross-sectional view showing a nanowire field-effect transistor according to an embodiment of the present invention.

Referring to FIGS. 1 and 2, a substrate 10 may be disposed. The substrate 10 may be a silicon substrate, a glass substrate, or a plastic substrate. In particular, when the substrate 10 is a glass substrate or a transparent plastic substrate, the substrate 10 may be used in a transparent display device. The substrate 10 may be removed later.

An asymmetrical nanowire 20 may be disposed on the substrate 10. The asymmetrical nanowire 20 may be disposed vertically to the substrate 10. The asymmetrical nanowire 20 may be a nanowire whose both ends have mutually different diameters. As an example, the diameter of the asymmetrical nanowire 20 may be reduced from a lower portion of the asymmetrical nanowire 20 adjacent to the substrate 10 toward an upper portion thereof.

The diameter of the asymmetrical nanowire 20 may be sequentially increased or reduced toward an upper portion of the substrate 10 within a range of 5 nm to 1 μm.

The asymmetrical nanowire 20 may include a nanowire channel 22, and a source region 24 and a drain region 26 positioned on both sides of the nanowire channel 22. That is, the source region 24 and the drain region 26 may be positioned at both ends with respect to the nanowire channel 22.

The length of the nanowire channel 22 may be 5 nm to 1 μm. The source region 24 may be adjacent to a region in which the diameter of the nanowire channel 22 is large. On the other hand, the drain region 26 may be adjacent to a region in which the diameter of the nanowire channel 22 is small.

The asymmetrical nanowire 20 may be easily formed using factors in the process such as undercut by isotropic etching that occurs due to characteristics of an etching mechanism, and the asymmetrical nanowire 20 may be formed to have a diameter smaller than a diameter of a lithographic pattern that can be formed. In this instance, the region in which the diameter of the asymmetrical nanowire 20 is large may be used as the source region 24, and the region in which the diameter of the asymmetrical nanowire 20 is small may be used as the drain region 26. The drain region may be connected to a drain transmission line 50.

As an example, the asymmetrical nanowire 20 may be made of silicon. The nanowire channel 22 has unique semiconductor characteristics, and the source region 24 and the drain region 26 may be a doping region in which concentration of impurities is higher than that in the nanowire channel 22.

The doping may be performed in such a manner that impurities are introduced to the source region 24 and the drain region 26. The impurities may be boron (B), boron difluoride ($BF_2$), phosphorus (P), arsenic (As), or antimony (Sb), but are not limited thereto.

The same kind of impurities may be introduced to the source region 24 and the drain region 26. However, the concentrations of the introduced impurities may be set to be mutually different. That is, the source region 24 and the drain region 26 may have a different concentration of impurities. In this instance, the concentration of the introduced impurities may be selected from $10^{17}$ cm$^{-3}$ to $10^{21}$ cm$^{-3}$.

A gate electrode 40 may be disposed so as to enclose the nanowire channel 22. Thus, the gate electrode 40 may have a structure of gate-all-around (GAA).

The gate electrode 40 may be made of a conductive material. As an example, the gate electrode 40 may be constituted of a semiconductor in which impurities with high concentration are introduced. For example, the gate electrode 40 may be made of silicon. In addition, the gate electrode 40 may be made of a metal. For example, the gate electrode 40 may be made of aluminum (Al), titanium (Ti), niobium (Nb), nickel (Ni), chromium (Cr), gold (Au), platinum (Pt), palladium (Pd), copper (Cu), tungsten (W), or an alloy thereof.

A gate insulation film 30 may be positioned between the nanowire channel 22 and the gate electrode 40. The gate insulation film 30 may be a silicon oxide film or a silicon nitride film. In addition, the gate insulation film 30 may be a high dielectric constant (high-k) film. For example, the gate insulation film 30 may be $Al_2O_3$, $TiO_2$, $ZrO_2$, $HfO_2$, $La_2O_3$, $Nb_2O_5$, $CeO_2$, $Bi_4Si_2O_{12}$, $Y_2O_3$, $LaAlO_3$, or $Ta_2O_5$.

Figure 3:
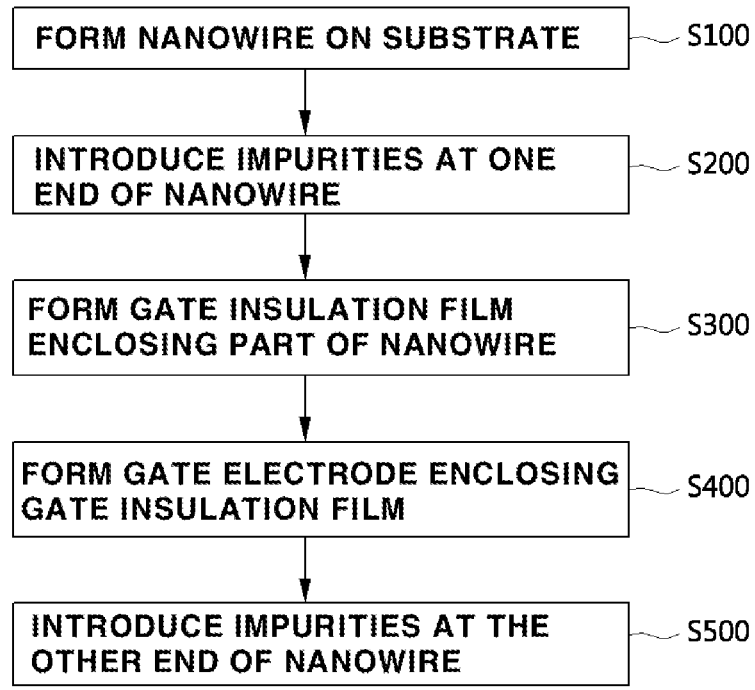
FIG. 3 is a process flowchart showing a method of manufacturing a nanowire field-effect transistor according to an embodiment of the present invention.

FIG. 3 is a process flowchart showing a method of manufacturing a nanowire field-effect transistor according to an embodiment of the present invention.

Referring to FIG. 3, in operation 5100, the asymmetrical nanowire 20 is formed on the substrate 10. The asymmetrical nanowire 20 may be formed vertically to the substrate 10.

The substrate 10 may be a silicon substrate, a glass substrate, or a plastic substrate.

The asymmetrical nanowire 20 may be made of silicon.

The asymmetrical nanowire 20 may be formed in such a manner that both ends of the asymmetrical nanowire 20 have mutually different diameters. As an example, the diameter of the asymmetrical nanowire 20 may be reduced from a lower portion of the asymmetrical nanowire 20 adjacent to the substrate 10 toward an upper portion thereof.

The asymmetrical nanowire 20 may be formed in a top-down method or a bottom-up method. The top-down method may include lithography and etching. The lithography may be photolithography, electron beam lithography, or nanoimprint lithography, but is not limited thereto. In addition, the etching may be dry etching using plasma or wet etching using an etching solution, but is not limited thereto.

On the other hand, the bottom-up method includes a vapor liquid solid (VLS) method, a method of using electrochemical techniques, and a method of forming a silicon channel layer on a template with an uneven structure which is formed in advance by a chemical vapor deposition method. In this instance, alignment of the nanowires may be carried out by self-assembly of a single molecule or a molecular manipulation method, but is not limited thereto.

Next, in operation 5200, impurities are introduced to an end of the asymmetrical nanowire 20. Any one of the source region and the drain region may be defined through the introduction of the impurities. As an example, the end of the asymmetrical nanowire 20 may be a lower portion 24 of the asymmetrical nanowire 20 adjacent to the substrate 10.

The introduction of the impurities may be carried out through thermal diffusion, ion implantation, or plasma doping, but is not limited thereto. The impurities may be introduced in a variety of methods that are commonly used.

As the impurities, boron (B), boron difluoride ($BF_2$), phosphorus (P), arsenic (As), or antimony (Sb) may be used. The impurities may be introduced at a concentration of approximately $10^{17}$ cm$^{-3}$ to $10^{21}$ cm$^{-3}$.

Next, in operation 5300, the gate insulation film 30 is formed so as to enclose a part of the asymmetrical nanowire 20. As an example, the gate insulation film 30 may be formed in a region excluding a region in which the impurities are introduced in advance from the asymmetrical nanowire 20 or a predetermined region of the both ends to which the impurities are introduced.

The gate insulation film 30 may be a silicon oxide film, a silicon nitride film, or a high dielectric constant (high-k) film. The gate insulation film 30 may be formed using a chemical vapor deposition (CVD) method, a plasma-enhanced chemical vapor deposition (PECVD) method, or an atomic layer deposition (ALD) method.

Next, in operation S400, the gate electrode 40 is formed so as to enclose the gate insulation film 30. The gate electrode 40 may be made of a conductive material. The gate electrode 40 may be formed using a sputtering method, an electron beam evaporation method, or a thermal deposition method.

Next, in operation S500, the impurities are introduced to the other end of the asymmetrical nanowire 20. Through the introduction of the impurities, any one of the source region and the drain region may be defined. As an example, the other end of the asymmetrical nanowire 20 may be an upper portion 26 of the asymmetrical nanowire 20 that extends vertically from the substrate 10.

The introduction of the impurities may be carried out through thermal diffusion, ion implantation, or plasma doping, but is not limited thereto. The impurities may be introduced in a variety of methods that are commonly used.

As the impurities, boron (B), boron difluoride ($BF_2$), phosphorus (P), arsenic (As), or antimony (Sb) may be used. The impurities may be introduced at a concentration of approximately $10^{17}$ cm$^{-3}$ to $10^{21}$ cm$^{-3}$.

The same kind of impurities may be introduced to the lower and upper portions 24 and 26 of the asymmetrical nanowire 20. However, the concentrations of the introduced impurities may be set to be mutually different.

Figure 4:
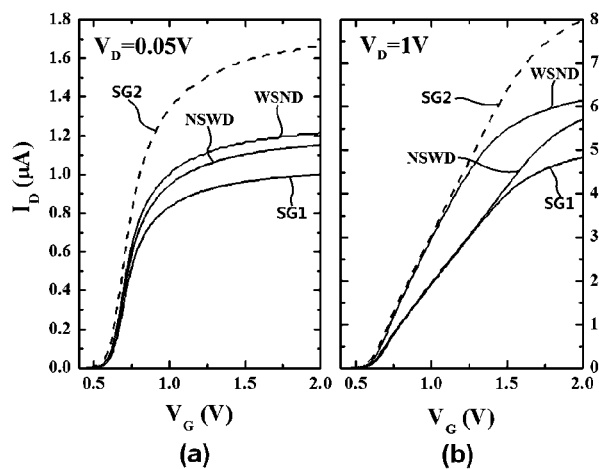
FIGS. 4(a) and 4(b) are graphs showing I-V characteristics depending on cross-sectional areas of source and drain regions of a nanowire field-effect transistor according to an embodiment of the present invention.

FIGS. 4(a) and 4(b) are graphs showing I-V characteristics depending on cross-sectional areas of source and drain regions of a nanowire field-effect transistor according to an embodiment of the present invention. FIG. 4(a) is a linear region ($V_D$=0.05V), and FIG. 4(b) is a saturation region ($V_D$=1V).

In FIGS. 4(a) and 4(b), results obtained by performing computer simulation on current-voltage of each of a case in which a diameter of 9 nm of the nanowire channel adjacent to the source region and a diameter of 9 nm of the nanowire channel adjacent to the drain region are the same (SG 1, $D_{NW}$=9 nm), a case in which a diameter of 12 nm of the nanowire channel adjacent to the source region and a diameter of 12 nm of the nanowire channel adjacent to the drain region are the same (SG 2, $D_{NW}$=12 nm), a case in which a diameter of 12 nm of the nanowire channel adjacent to the source region is different from a diameter of 9 nm of the nanowire channel adjacent to the drain region (WSND), and a case in which a diameter of 9 nm of the nanowire channel adjacent to the source region is different from a diameter of 12 nm of the nanowire channel adjacent to the drain region (NSWD) are shown.

Referring to FIGS. 4(a) and 4(b), a current level of WSND and NSWD is positioned between SG1 and SG2. In addition, the ON current of each of WSND and NSWD is increased than that of SG1.

In the linear region (see FIG. 4(a)), the currents of WSND and NSWD exhibit almost the same characteristics. However, in the saturation region (see FIG. 4(b)), it can be seen that there is a difference between the currents of WSND and NSWD.

In the case of the saturation region (see FIG. 4(b)), it can be seen that a similar current level is shown at a high voltage of approximately 2 V, but current driving force at a voltage of 1 V to 2 V is higher in WSND than that in NSWD. As an example, when a gate voltage ($V_g$) is 1 V in the saturation region (see FIG. 4(b)), it can be seen that the current of WSND is higher by 50% or greater than the current of NSWD. Thus, in the saturation region (see FIG. 4(b)), it can be seen that driving capability of the gate electrode after a threshold voltage (approximately 0.5 V) is improved.

Figure 5:
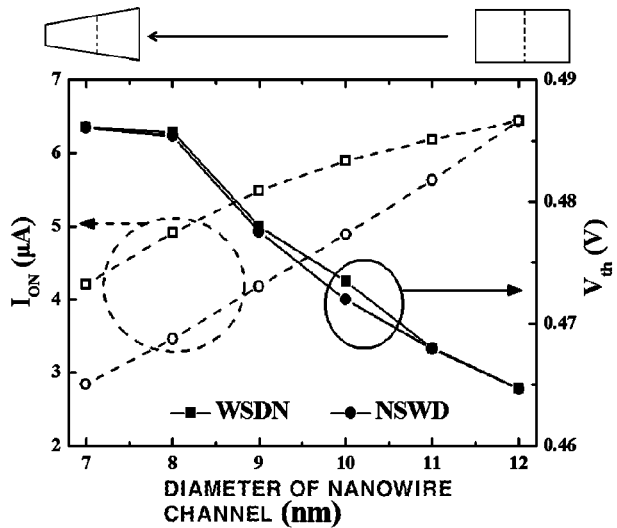
FIG. 5 is a graph showing an ON current and a threshold voltage of a nanowire field-effect transistor according to an embodiment of the present invention.

FIG. 5 is a graph showing an ON current ($I_{on}$) and a threshold voltage ($V_{th}$) of a nanowire field-effect transistor according to an embodiment of the present invention. In FIG. 5, results in which the ON current and the threshold voltage are extracted by performing computer simulation in such a manner that any one of the diameters of the nanowire channel adjacent to the source region and the drain region is fixed as 12 nm and the other one thereof is changed from 7 nm up to 12 nm are shown. A case in which the diameter of the nanowire channel adjacent to the source region is large is represented as WSND and a case in which the diameter of the nanowire channel adjacent to the source region is small is represented as NSWD. In this instance, a threshold voltage was extracted through a constant current method, and an ON current was measured in the saturation region ($V_g$=1.5 V, $V_D$=1 V) as a drain current at a gate voltage of the threshold voltage or greater.

Referring to FIG. 5, it can be seen that the transition of the variation of the threshold voltage of WSND and NSWD are almost the same. This may be because the threshold voltage is determined in accordance with an amount of inverted charges and the inverted charges are controlled only by the gate electrode.

On the other hand, in the ON current, it can be seen that there is a large difference between WSND and NSWD. The ON current of NSWD is rapidly reduced compared to that of WSND.

Thus, in order to increase the ON current in a state in which a threshold voltage level of a device is kept the same as that of an existing device and to improve current driving capability of the gate electrode, the device may be designed considering the asymmetrical nanowire in which the diameter of the nanowire is irregular. In this instance, it is preferably that the source region be positioned in a region in which the diameter of the asymmetrical nanowire is large and the drain region be positioned in a region in which the diameter of the asymmetrical nanowire is small.

A process of manufacturing such an asymmetrical nanowire may be readily performed using factors in the process such as undercut by isotropic etching that occurs due to characteristics of an etching mechanism and the nanowire may be formed to have a diameter smaller than a diameter of a lithographic pattern that can be formed, and therefore there are advantages in the performance improvement of the device.

FIGS. 6(a) and 6(b) are graphs showing I-V characteristics depending on concentration of impurities of source and drain regions of a nanowire field-effect transistor according to an embodiment of the present invention. FIG. 6(a) is a linear region ($V_D$=0.05 V), and FIG. 6(b) is a saturation region ($V_D$=1 V).

In FIGS. 6(a) and 6(b), results obtained by performing computer simulation on a device (WSND) in which the diameter of the nanowire channel adjacent to the source region is 12 nm and the diameter of the nanowire channel adjacent to the drain region is 9 nm while changing concentrations of impurities of the source region and the drain region are shown.

In this instance, in the device, a case in which the concentration of $10^{19}$ cm$^{-3}$ of impurities of the source region and the concentration of $10^{19}$ cm$^{-3}$ of impurities of the drain region are the same is represented as SD, a case in which the concentration of $10^{19}$ cm$^{-3}$ of impurities of the source region is smaller than the concentration of $10^{20}$ cm$^{-3}$ of impurities of the drain region is represented as LSHD, and a case in which the concentration of $10^{20}$ cm$^3$ of impurities of the source region is larger than the concentration of $10^{19}$ cm$^3$ of impurities of the drain region is represented as HSLD.

Referring to FIGS. 6(a) and 6(b), in the linear region (see FIG. 6(a)) and the saturation region (see FIG. 6(b)), it can be seen that a current level of LSHD and a current level of HSLD are higher than a current level of SD. That is, a case in which the concentrations of the impurities introduced to the source region and the drain region are different from each other exhibits a higher current level than that in a case in which the concentrations of the impurities introduced to the source region and the drain region are the same. This may be because a high doping concentration leads to a reduction in series resistance.

In a case of HSLD, it can be seen that overall current characteristics such as the slope of the graph are similar to those of SD. However, the ON current of HSLD is significantly increased than that of SD.

In a case of LSHD, it can be seen that the ON current is slightly smaller than that of HSLD, but is larger than that of SD. In addition, in the case of LSHD, it can be seen that a current value is significantly steeply increased along with an increase in the gate voltage ($V_g$). In this case, the operating speed of the device may be significantly suitable for a switching operation.

Figure 7:
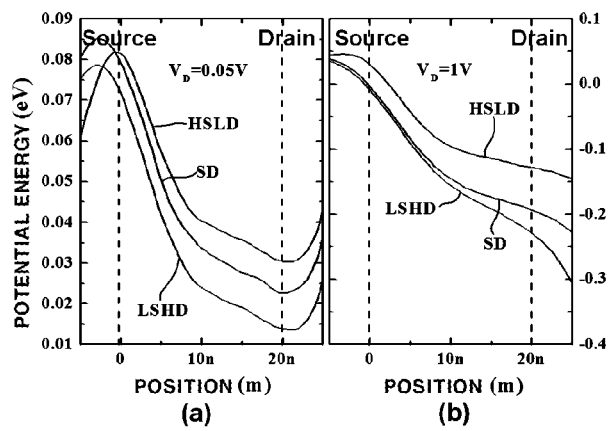
FIGS. 7(a) and 7(b) are graphs showing potential energy of a nanowire field-effect transistor according to an embodiment of the present invention.

FIGS. 7(a) and 7(b) are graphs showing potential energy of a nanowire field-effect transistor according to an embodiment of the present invention. FIG. 7(a) is a linear region ($V_D$=0.05 V), and FIG. 7(b) is a saturation region ($V_D$=1 V).

Figure 8:
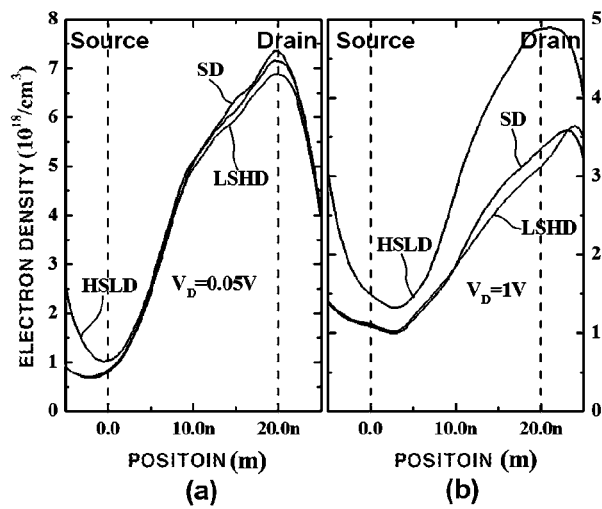
FIGS. 8(a) and 8(b) are graphs showing electron density of a nanowire field-effect transistor according to an embodiment of the present invention.

FIGS. 8(a) and 8(b) are graphs showing electron density of a nanowire field-effect transistor according to an embodiment of the present invention. FIG. 8(a) is a linear region ($V_D$=0.05 V), and FIG. 8(b) is a saturation region ($V_D$=1 V).

Figure 6:
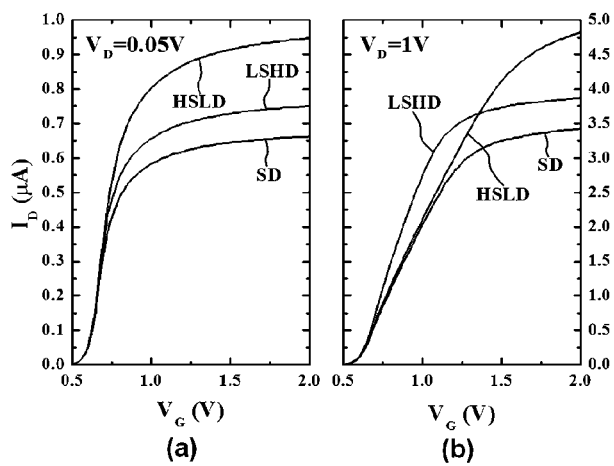
FIGS. 6(a) and 6(b) are graphs showing I-V characteristics depending on concentration of impurities of source and drain regions of a nanowire field-effect transistor according to an embodiment of the present invention.

In FIGS. 7(a) to 8(b), in order to explain the phenomenon of FIG. 6, results obtained by performing computer simulation on a device in which the diameter of the nanowire channel adjacent to the source region is 12 nm and the diameter of the nanowire channel adjacent to the drain region is 9 nm while changing the concentrations of impurities of the source region and the drain region are shown.

In this instance, in the device, a case in which the concentration of $10^{19}$ cm$^{-3}$ of impurities of the source region and the concentration of $10^{19}$ cm$^{-3}$ of impurities of the drain region are the same is represented as SD, a case in which the concentration of $10^{19}$ cm$^{-3}$ of impurities of the source region is smaller than the concentration of $10^{20}$ cm$^{-3}$ of impurities of the drain region is represented as LSHD, and a case in which the concentration of $10^{20}$ cm$^{-3}$ of impurities of the source region is larger than the concentration of $10^{19}$ cm$^{-3}$ of impurities of the drain region is represented as HSLD.

Referring to FIGS. 6(a), 7(a), and 8(a), there is a slight difference in the sizes of the potential energy (see FIG. 7(a)) in the linear region, but distribution of the potential energy shows a tendency similar to each other regardless of the concentrations of impurities of the source region and the drain region.

On the other hand, the profiles of the electron density (see FIG. 8(a)) show very similar to each other regardless of the concentrations of impurities of the source region and the drain region. However, in a position of 0 nm or less, it can be seen that an amount of electrons introduced from the source into the channel is increased along with an increase in the concentration of impurities of the source region.

In the linear region, the total current may be determined in accordance with a drift current. The drift current is in proportion to the density of the electrons introduced from the source into the channel and an electric field applied to the channel. Thus, as shown in FIG. 6(a), a difference in the current levels is shown. That is, HSLD has a larger current level than that in SD and LSHD.

Meanwhile, referring to FIGS. 6(b), 7(b), and 8(b), it can be seen that there is a large difference in distributions (see FIG. 7(b)) of the potential energy in the saturation region in cases of SD, LSHD, and HSLD.

It can be seen that LSHD shows a sudden voltage drop within the channel due to low resistance of the drain region compared to SD or HSLD. This may lead to a large electric field, and therefore it can be seen that the drift current by the electric field is increased in the case of LSHD.

The saturation region may be affected by a diffusion current in addition to the drift current. As shown in FIG. 8(b), the profile of the electron density shows the diffusion current that flows in a direction opposite to that of the total current.

As can be seen from the slope of the graph, LSHD is least affected by the diffusion current. Thus, LSHD may have a high sensitivity to control the gate electrode by a large internal electric field and a small diffusion current. However, since the concentration of impurities introduced to the source region is small, the amount of electrons introduced from the source region is limited, and therefore the ON current is maintained at a predetermined level.

In the case of HSLD, it can be seen that a voltage drop within the channel is lowest even though HSLD has the same drain concentration as that of SD. Thus, the internal electric field within the channel is also lowest. However, in the case of HSLD, the amount of the electrons introduced from the source into the channel is larger by at least 50% than that in other cases, and therefore the drift current is shown very large.

In addition, in the case of HSLD, in the distribution (see FIG. 8(b)) of the electron density, the electric field flows in the opposite direction due to a sudden change of the electron density even though the amount of the electrons introduced in a position of 0 nm or less is large, and therefore the diffusion current is increased than that of LSHD.

Thus, HSLD may be affected by both the drift current and the diffusion current, and as shown in FIG. 6(b), HSLD shows the ON current level larger than that in other cases.

That is, due to a difference in the concentrations of impurities of the source region and the drain region which are adjacent to the nanowire channel, the saturation region may be affected simultaneously by the internal electric field by the potential energy distribution, the drift current by the amount of the electrons introduced from the source, and the diffusion current that flows in the direction opposite to an external electric field by an electron density gradient.

Thus, in the case of LSHD in which the concentration of impurities of the drain region is higher than the concentration of impurities of the source region, an increase in the drift current due to an increase in the internal electric field of the channel may act predominantly. The change in the internal electric field of the channel may determine switching characteristics of the device, and therefore the current drivability of the gate electrode may be improved after a threshold voltage of the device compared to other cases in the saturation region.

On the other hand, in the case of HSLD in which the concentration of impurities of the source region is higher than the concentration of impurities of the drain region, the drift current by the amount of the electrons introduced from the source and the diffusion current that flows in the direction opposite to the external electric field by the electron density gradient act simultaneously, whereby the ON current may be increased.

Figure 9:
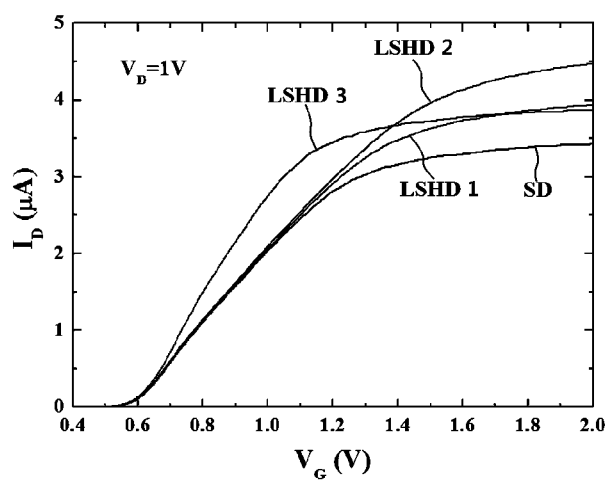
FIG. 9 is a graph showing I-V characteristics depending on concentration of impurities of a drain region of a nanowire field-effect transistor according to an embodiment of the present invention.

FIG. 9 is a graph showing I-V characteristics depending on concentration of impurities of a drain region of a nanowire field-effect transistor according to an embodiment of the present invention.

In FIG. 9, in a device in which the diameter of the nanowire channel adjacent to the source region is 12 nm and the diameter of the nanowire channel adjacent to the drain region is 9 nm, results obtained by performing computer simulation on a current-voltage transmission characteristic curve in the saturation region in such a manner that the concentration ($N_{SRC}$) of impurities of the source region is fixed as $10^{19}$ cm$^{-3}$ and the concentration ($N_{DRN}$) of impurities of the drain region is changed to $1 \times 10^{19}$ cm$^{-3}$ (SD), $2 \times 10^{19}$ cm$^{-3}$ (LSHD 1), $5 \times 10^{19}$ cm$^{-3}$ (LSHD 2), and $1 \times 10^{20}$ cm$^{-3}$ (LSHD 3), respectively are shown.

Referring to FIG. 9, it can be seen that a phenomenon (HSLD) in which the ON current is increased in the saturation region shown in FIG. 6 occurs even in cases of LSHD1 and LSHD2 in which the difference in the concentrations of impurities of the source region and the drain region is small.

Thus, when desiring to obtain a larger ON current, the concentration of impurities of the drain region lower than the concentration of impurities of the source region is introduced, or even in a case in which the concentration of impurities of the source region is larger than the concentration of impurities of the drain region, the difference in the concentrations of impurities may be designed to be small.

In addition, when desiring to obtain current drivability of the gate electrode after the more improved threshold voltage, the concentration of impurities of the drain region may be designed to be larger than the concentration of impurities of the source region.

That is, by adjusting the concentrations of impurities of the source region and the drain region, the device having characteristics suitable for the field of applications may be designed.

In this specification, exemplary embodiments of the present invention have been classified into the first, second, and third exemplary embodiments and described for conciseness. However, respective steps or functions of an exemplary embodiment may be combined with those of another exemplary embodiment to implement still another exemplary embodiment of the present invention.

While the invention has been shown and described with reference to certain exemplary embodiments thereof, it will be understood by those skilled in the art that various changes in form and details may be made therein without departing from the spirit and scope of the invention as defined by the appended claims.

THE DESCRIPTION OF REFERENCE NUMERALS OF THE MAIN ELEMENTS IN DRAWINGS

10: Substrate
20: Asymmetrical nanowire
22: Nanowire channel
24: Source region

26: Drain region
30: Gate insulation film
40: Gate electrode

The invention claimed is:
1. A nanowire field-effect transistor comprising:
   an asymmetrical nanowire channel whose both ends have mutually different diameters;
   a source region that is adjacent to a region in which the diameter of the nanowire channel is large;
   a drain region that is adjacent to a region in which the diameter of the nanowire channel is small;
   a gate electrode that encloses the nanowire channel; and
   a gate insulation film that is positioned between the nanowire channel and the gate electrode.
2. The nanowire field-effect transistor according to claim 1, wherein the diameter of the asymmetrical nanowire channel is reduced from the source region toward the drain region.
3. The nanowire field-effect transistor according to claim 1, further comprising
   a substrate that is disposed adjacent to the source region.
4. The nanowire field-effect transistor according to claim 3, wherein the nanowire channel is formed vertically to the substrate.
5. The nanowire field-effect transistor according to claim 1, wherein the asymmetrical nanowire channel is made of silicon.
6. The nanowire field-effect transistor according to claim 1, wherein the diameter of the asymmetrical nanowire channel is 5 nm to 1 μm.
7. The nanowire field-effect transistor according to claim 1, wherein the same impurities are introduced to the source region and the drain region, and concentrations of the introduced impurities are mutually different.
8. The nanowire field-effect transistor according to claim 7, wherein the concentration of the impurities introduced to the drain region is higher than the concentration of the impurities introduced to the source region.
9. The nanowire field-effect transistor according to claim 7, wherein the impurities are boron (B), boron difluoride ($BF_2$), phosphorus (P), arsenic (As), or antimony (Sb).
10. A method for manufacturing a nanowire field-effect transistor comprising:
    forming an asymmetrical nanowire whose both ends have mutually different diameters;
    defining any one of a source region and a drain region by introducing impurities at an end of the nanowire;
    forming a gate insulation film so as to enclose a part of the nanowire;
    forming a gate electrode so as to enclose the gate insulation film; and
    defining the remaining one of the source region and the drain region by introducing the impurities at the other end of the nanowire.
11. The method for manufacturing the nanowire field-effect transistor according to claim 10, wherein the asymmetrical nanowire is formed in a top-down method or a bottom-up method.
12. The method for manufacturing the nanowire field-effect transistor according to claim 10, wherein concentration of the impurities introduced to the end of the nanowire and concentration of the impurities introduced to the other end thereof are made different from each other.
13. The method for manufacturing the nanowire field-effect transistor according to claim 10, wherein concentration of the introduced impurities is $10^{17}$ $cm^{-3}$ to $10^{21}$ $cm^{-3}$.

* * * * *